(12) United States Patent
Zhang et al.

(10) Patent No.: US 7,742,286 B2
(45) Date of Patent: Jun. 22, 2010

(54) MOUNTING APPARATUS FOR MOUNTING CIRCUIT BOARD

(75) Inventors: Guang-Yi Zhang, Shenzhen (CN); Zhe Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/137,777

(22) Filed: Jun. 12, 2008

(65) Prior Publication Data

US 2009/0154118 A1 Jun. 18, 2009

(30) Foreign Application Priority Data

Dec. 13, 2007 (CN) .................... 2007 1 0203041

(51) Int. Cl.
*H05K 7/12* (2006.01)
(52) U.S. Cl. .................. 361/679.02; 361/755; 361/807; 312/223.2
(58) Field of Classification Search ............ 361/679.32, 361/679.02, 755, 807; 312/223.2
See application file for complete search history.

(56) References Cited

U.S. PATENT DOCUMENTS

| 6,639,807 | B1 * | 10/2003 | Carney et al. ............... 361/759 |
| 6,937,467 | B2 * | 8/2005 | Hsu ...................... 361/679.41 |
| 7,016,188 | B2 * | 3/2006 | Chen ..................... 361/679.58 |
| 7,326,077 | B2 * | 2/2008 | Shih et al. .................... 439/372 |
| 7,545,650 | B2 * | 6/2009 | Sanchez et al. ............. 361/759 |

* cited by examiner

*Primary Examiner*—Jayprakash N Gandhi
*Assistant Examiner*—Ingrid Wright
(74) *Attorney, Agent, or Firm*—D. Austin Bonderer

(57) ABSTRACT

A mounting apparatus includes a bottom plate, a bracket fixed to the bottom plate, and a clamp rotatably mounted to the bottom plate. The bracket includes a first and a second mounting piece. The second mounting piece defines a mounting groove for receiving an edge of a circuit board. The first mounting piece includes a mounting portion, and a fixing piece extending from the mounting portion. The mounting portion includes a post for engaging in a hole of the circuit board. The fixing piece defines a clamping hole. The clamp includes an elastic piece, and a plurality of clips. The elastic piece is configured to move with the clamp to insert through the clamping hole and catch the first mounting piece. The clips are configured to move with the clamp to clip the circuit board to the fixing piece.

13 Claims, 4 Drawing Sheets

MOUNTING APPARATUS FOR MOUNTING CIRCUIT BOARD

BACKGROUND

1. Field of the Invention

The present invention relates to mounting apparatuses, and more particularly to a mounting apparatus for mounting a circuit board in a computer case.

2. Description of Related Art

Computer systems typically require or include circuit boards such as expansion cards which extend the capabilities of computer systems by providing dedicated hardware to achieve a variety of tasks. A conventional expansion card is typically installed in a computer case with screws. However, it is not convenient to drive screws to install or remove the expansion card in a narrow space of the computer case.

What is desired, therefore, is a mounting apparatus that allows convenient mounting and removal of a circuit board.

SUMMARY

An exemplary mounting apparatus includes a bottom plate, a bracket fixed to the bottom plate, and a clamp rotatably mounted to the bottom plate. The bracket includes a first and second mounting piece. The second mounting piece defines a mounting groove for receiving an edge of a circuit board. The first mounting piece includes a mounting portion, and a fixing piece extending from the mounting portion. The mounting portion includes a post for engaging in a hole of the circuit board. The fixing piece defines a clamping hole. The clamp includes an elastic piece, and a plurality of clips. The elastic piece is configured to move with the clamp to insert through the clamping hole and catch the first mounting piece. The clips are configured to move with the clamp to clip the circuit board to the fixing piece.

Other advantages and novel features will become more apparent from the following detailed description of embodiment when taken in conjunction with the accompanying drawings, in which:

DETAILED DESCRIPTION

Figure 1:
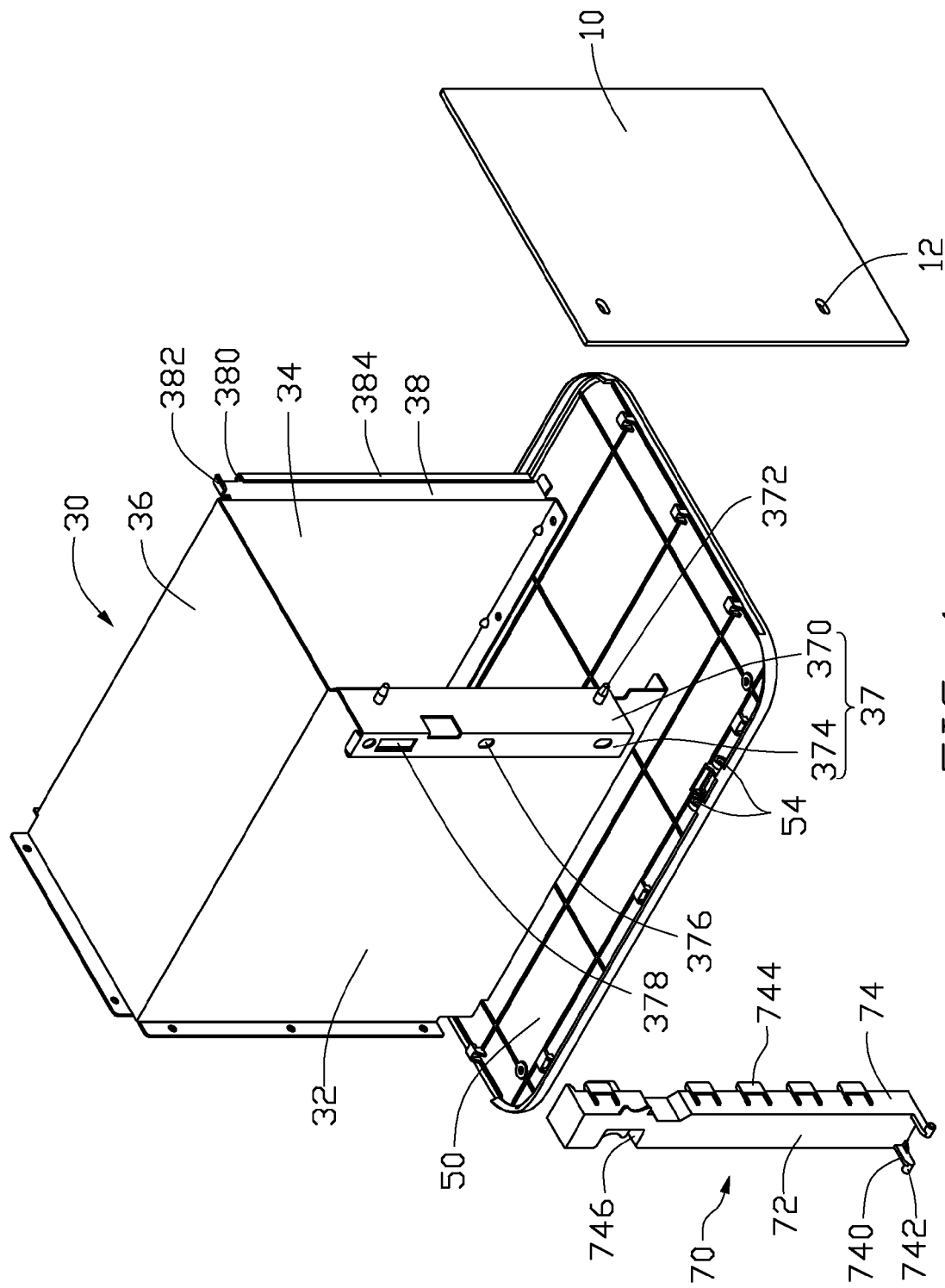
FIG. 1 is an exploded, isometric view of a mounting apparatus and a circuit board in accordance with an embodiment of the present invention, the mounting apparatus including a clamp.

Referring to FIG. 1, a mounting apparatus in accordance with an embodiment of the present invention is used for mounting a circuit board 10, such as an expansion card, to a computer case. The computer case includes a bottom plate 50 defining two aligned pivot holes 54. The circuit board 10 defines two ellipse-shaped holes 12. The mounting apparatus includes a bracket 30, and a clamp 70.

The bracket 30 is generally n-shaped and is fixed to the bottom plate 50. The bracket 30 includes a top board 36, and a first side board 32 and a second side board 34.

The first side board 32 of the bracket 30 includes a first mounting piece 37 extending from one end thereof. The first mounting piece 37 includes a mounting portion 370 perpendicularly extending from the end of the first side board 32, and a fixing piece 374 perpendicularly extending from a free side of the mounting portion 370 toward the other end of the first side board 32. The mounting portion 370 includes two posts 372 extending therefrom, corresponding to the two holes 12 of the circuit board 10. The fixing piece 374 defines three mounting holes 376 and a clamping hole 378 therein.

The second side board 34 of the bracket 30 includes a second mounting piece 38 perpendicularly extending from an end thereof. The second mounting piece 38 is located in a same plane as the mounting portion 370 of the first mounting piece 37 of the first side board 32. The second mounting piece 38 includes a bent portion 384 perpendicularly extending from a free side thereof away from the other end of the second board 34 and then being perpendicularly bent toward the first side board 32 to form a mounting groove 380. The second mounting piece 38 includes two latch pieces 382 respectively extending from opposite ends thereof.

Figure 2:
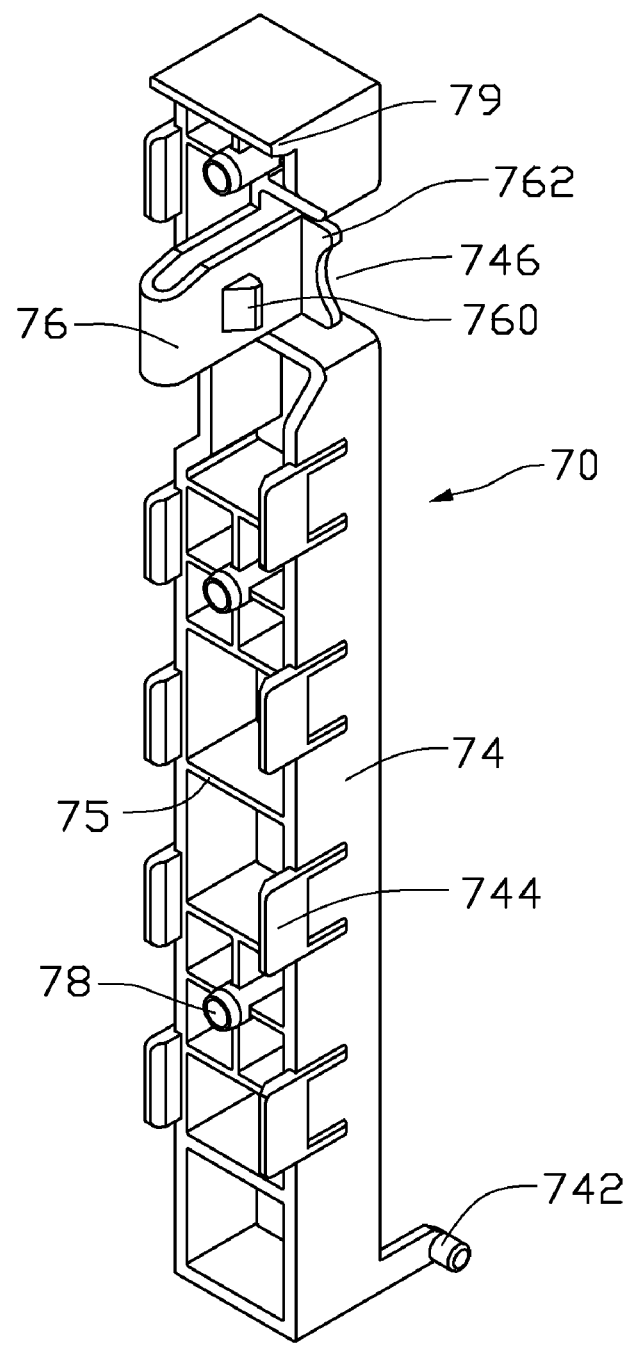
FIG. 2 is an isometric view of the clamp in FIG. 1.

Referring also to FIG. 2, the clamp 70 is a rectangular-shaped bar and includes a first wall 72, and two opposite second walls 74 adjoining the first wall 72. A plurality of ribs 75 is connected between the first wall 72 and the second walls 74 in the clamp 70. Three aligned mounting posts 78 extend from the clamp 70 to the opposite side of the first wall 72, corresponding to the mounting holes 376 of the first mounting piece 37 of the bracket 30. A pressing block 79 extends from an upper end of the clamp 70 opposite to the first wall 72. The first wall 72 includes two protrusions 740 extending from a lower end thereof. Two aligned pivots 742 respectively extend from the two protrusions 740, corresponding to the pivot holes 54 of the bottom plate 50 of the computer case. A plurality of clips 744 extend from the two second walls 74 respectively and one of the second walls 74 defines a cutout 746. A U-shaped elastic piece 76 extends outward from an inner wall of the cutout 746 adjacent the pressing block 79 and then turns back into the cutout 746. The elastic piece 76 includes an operating portion 762 extending from a free end thereof, and a catching protrusion 760 extending therefrom and located at the same side with the operating portion 762.

Figure 3:
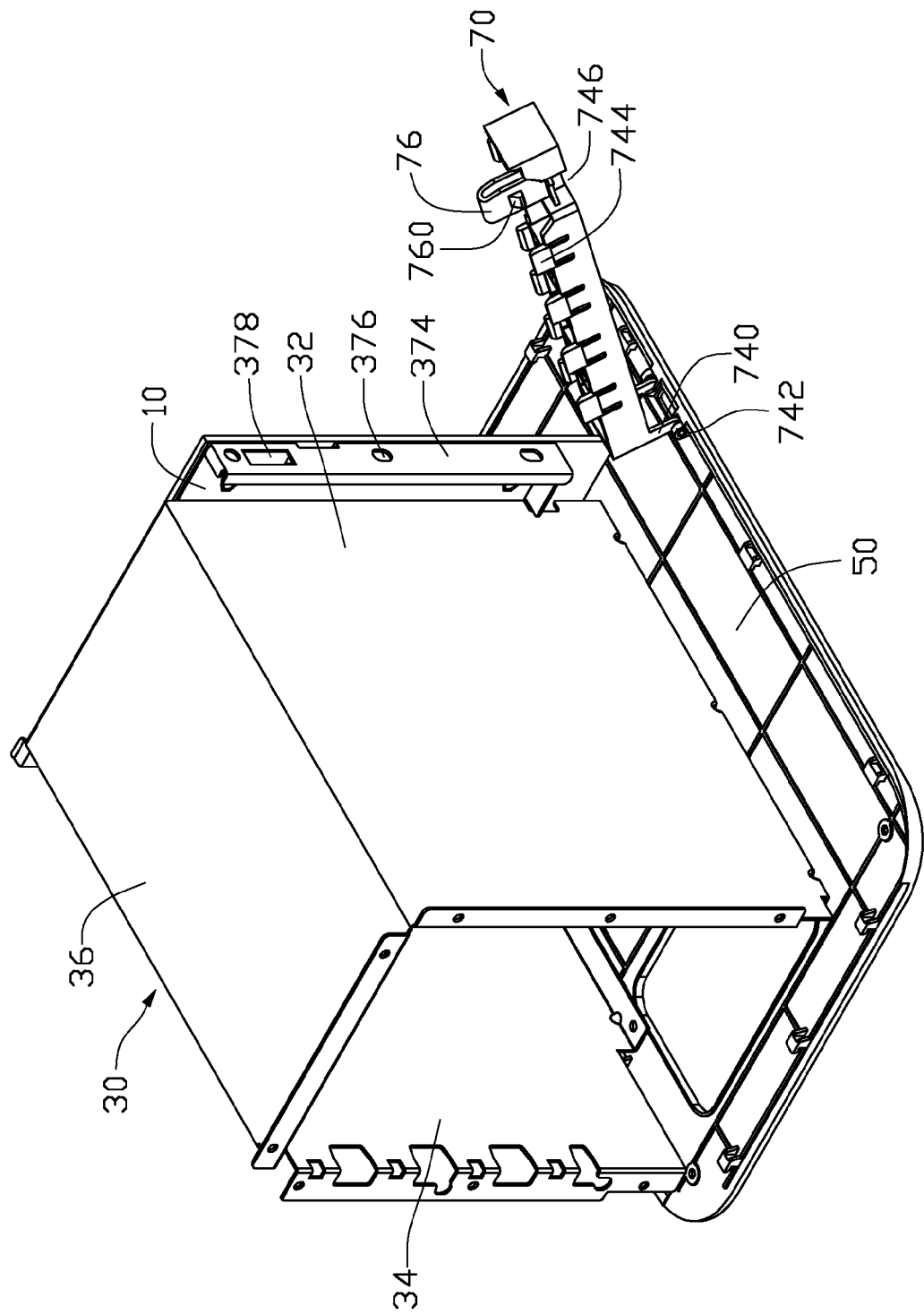
FIG. 3 is a partially assembled view of FIG. 1, but viewed from another aspect.
Figure 4:
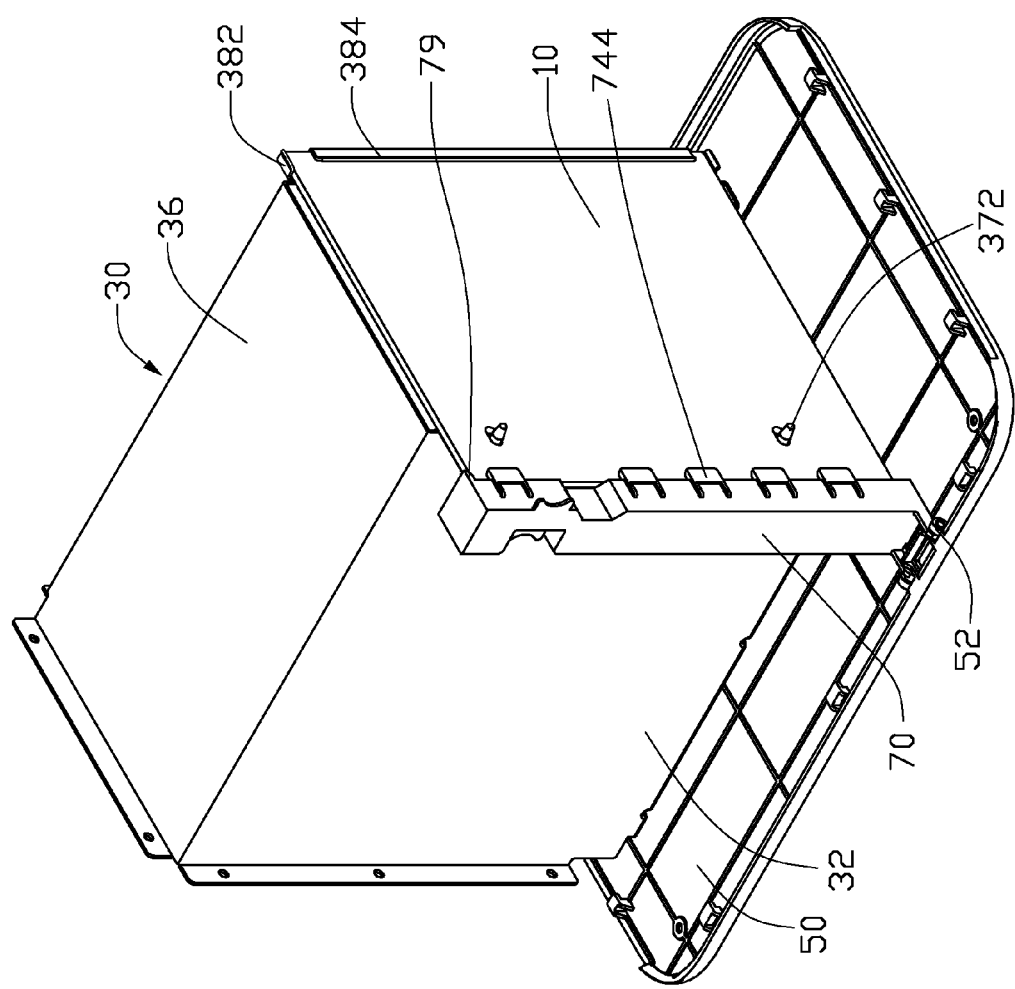
FIG. 4 is an assembled view of FIG. 1.

Referring also to FIGS. 3 and 4, in assembly, the pivots 742 of the clamp 70 are respectively pivotably engaged in the corresponding pivot holes 54 of the bottom plate 50. Ends of the posts 372 of the first mounting piece 37 are respectively inserted through the corresponding holes 12 of the circuit board 10 so as to support a corresponding end of the circuit board 10. The posts 372 are slid in the corresponding holes 12 to make a corresponding side of the circuit board 10 to be inserted in the mounting groove 380 of the second mounting piece 38 of the bracket 30. The two latch pieces 382 of the second mounting piece 38 clip another two opposite sides of the circuit board 10. The clamp 70 is rotated to engage with the first mounting piece 37 of the bracket 30, such that the elastic piece 76 of the clamp 70 is inserted through the clamping hole 378 of the first mounting piece 37 and catches the first mounting piece 37 via the catching protrusion 760 thereof. The mounting posts 78 of the clamp 70 are engaged in the corresponding mounting holes 376 of the first mounting piece 37, the pressing block 79 of the clamp 70 presses a top end of the first mounting piece 70, and the clips 744 of the clamp 70 clip a free side of the fixing piece 374 of the first mounting piece 70 and a corresponding edge of the circuit board 10.

In disassembly, the operating portion 762 of the elastic piece 76 of the clamp 70 is pressed to deform the elastic piece 76. Then, the clamp 70 is rotated away from the bracket 30 to make the catching protrusion 760 of the elastic piece 76 to disengage from the first mounting piece 37. Then, the circuit board 10 can be easily disassembled from the mounting apparatus.

It is believed that the present embodiment and its advantages will be understood from the foregoing description, and they will be apparent that various changes may be made thereto without departing from the spirit and scope of the invention or sacrificing all of its material advantages, the examples hereinbefore described merely being preferred or exemplary embodiment of the invention.

What is claimed is:

1. A mounting apparatus, the mounting apparatus comprising:
    a bottom plate;
    a bracket fixed to the bottom plate, wherein the bracket comprises a first mounting piece and a second mounting piece; the second mounting piece defines a mounting groove for receiving an edge of a circuit board; the first mounting piece comprises a mounting portion extending from the bracket, and a fixing piece extending from the mounting portion; the mounting portion of the first mounting piece comprises a post for engaging a hole of the circuit board; the fixing piece defines a clamping hole therein; and
    a clamp rotatably mounted to the bottom plate, wherein the clamp comprises an elastic piece extending therefrom, and a plurality of clips extending therefrom; the clamp is rotatably attached to the bottom plate; the elastic piece is capable of being inserted through the clamping hole of the first mounting piece and to catch the first mounting piece; the plurality of clips are configured to clip the circuit board to the first mounting piece.

2. The mounting apparatus as claimed in claim 1, wherein the second mounting piece of the bracket further comprises two latch pieces for securing the circuit board.

3. The mounting apparatus as claimed in claim 1, wherein the fixing piece further defines a plurality of mounting holes therein, the clamp further comprises a plurality of mounting posts that engage the mounting holes when the clamp engages with the mounting portion.

4. The mounting apparatus as claimed in claim 1, wherein the clamp further comprises a pressing block extending therefrom, when the clamp engages with the mounting portion, the pressing block of the clamp presses an end of the fixing piece of the first mounting piece of the bracket.

5. The mounting apparatus as claimed in claim 1, wherein the second mounting piece comprises a bent portion that forms the mounting groove.

6. The mounting apparatus as claimed in claim 5, wherein the second mounting piece is located in a same plane as the mounting portion.

7. The mounting apparatus as claimed in claim 1, wherein the elastic piece of the clamp is U-shaped, the elastic piece further comprises a catching protrusion that is capable of going through the clamping hole and catching the fixing piece.

8. The mounting apparatus as claimed in claim 7, wherein the elastic piece of the clamp comprises an operating portion extending from a free end thereof.

9. The mounting apparatus as claimed in claim 1, wherein the bracket comprises a top board, a first side board, and a second side board; the first mounting piece of the bracket extends perpendicularly from the first side board; the second mounting piece of the bracket extends perpendicularly from the second side board.

10. An apparatus comprising:
    a circuit board comprising first and second ends;
    a first side board engagable with the first end;
    a second side board configured to hold the second end of the circuit board in place;
    a clamp comprising one or more clips that secure the first end of the circuit board to the first side board, wherein the clamp is capable of rotation and the rotational movement is parallel with the circuit board; and
    a bottom plate, wherein the clamp is pivotably mounted to the bottom plate.

11. The apparatus as claimed in claim 10, wherein the first side board comprises a post, the circuit board defines an ellipse-shaped hole, and the post is received by the ellipse-shaped hole.

12. The apparatus as claimed in claim 10, wherein the second side board defines a mounting groove for receiving the second end of the circuit board, a pair of latch pieces extends from the second side board for securing the circuit board.

13. The apparatus as claimed in claim 10, wherein the circuit board is an expansion card.

* * * * *